(12) United States Patent
Saito et al.

(10) Patent No.: US 10,049,722 B2
(45) Date of Patent: *Aug. 14, 2018

(54) APPARATUSES AND METHODS FOR A MEMORY DEVICE WITH DUAL COMMON DATA I/O LINES

(71) Applicant: MICRON TECHNOLOGY, INC., Boise, ID (US)

(72) Inventors: Shunichi Saito, Ebina (JP); Toshio Sugano, Kodaira (JP); Atsushi Hiraishi, Annaka (JP); Atsuo Koshizuka, Fujimino (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/719,349

(22) Filed: Sep. 28, 2017

(65) Prior Publication Data

US 2018/0197595 A1 Jul. 12, 2018

Related U.S. Application Data

(63) Continuation of application No. 15/400,653, filed on Jan. 6, 2017, now Pat. No. 9,805,786.

(51) Int. Cl.
*G11C 5/06* (2006.01)
*G11C 11/4093* (2006.01)
(Continued)

(52) U.S. Cl.
CPC ...... *G11C 11/4093* (2013.01); *G11C 11/4074* (2013.01); *G11C 11/4076* (2013.01); *G11C 11/4087* (2013.01); *G11C 11/4091* (2013.01); *G11C 11/4096* (2013.01); *G11C 11/4097* (2013.01)

(58) Field of Classification Search
CPC ............ G11C 11/4093; G11C 11/4074; G11C 11/4076; G11C 11/4091; G11C 11/4096; G11C 11/4097
See application file for complete search history.

(56) References Cited

U.S. PATENT DOCUMENTS 5,285,416 A * 2/1994 Tokami ............... G11C 11/4096
365/190
5,590,086 A * 12/1996 Park ..................... G11C 11/4076
365/149

(Continued)

OTHER PUBLICATIONS

International Search Report and Written Opinion dated Apr. 16, 2018 for PCT Application No. PCT/US2017/066769.

*Primary Examiner* — Pho M Luu
(74) *Attorney, Agent, or Firm* — Dorsey & Whitney LLP

(57) ABSTRACT

Apparatuses are presented for a semiconductor device utilizing dual I/O line pairs. The apparatus includes a first I/O line pair coupled to a first local I/O line pair. A second I/O line pair may be provided coupled to a second local I/O line pair. The apparatus may further include a first bit line including at least a first memory cell and a second memory cell, and a second bit line including at least a third memory cell and a fourth memory cell may be provided. The first local I/O line pair may be coupled to at least one of the first and second bit lines, and the second local I/O line pair is coupled to at least one of the first and second bit lines.

20 Claims, 9 Drawing Sheets

(51) Int. Cl.
 *G11C 11/408* (2006.01)
 *G11C 11/4076* (2006.01)
 *G11C 11/4074* (2006.01)
 *G11C 11/4097* (2006.01)
 *G11C 11/4096* (2006.01)
 *G11C 11/4091* (2006.01)

(56) References Cited

U.S. PATENT DOCUMENTS

| | | | |
|---|---|---|---|
| 6,088,276 A * | 7/2000 | Ukita | G11C 7/1051 |
| | | | 365/207 |
| 6,285,602 B1 | 9/2001 | Tanida et al. | |
| 6,870,205 B2 | 3/2005 | Lee et al. | |
| 7,796,453 B2 | 9/2010 | Riho et al. | |
| 8,422,318 B2 | 4/2013 | Hwang | |
| 9,805,786 B1 | 10/2017 | Saito et al. | |
| 9,805,798 B2 * | 10/2017 | Shiino | G11C 16/0483 |
| 2008/0080280 A1 | 4/2008 | Jeong et al. | |
| 2008/0205177 A1 | 8/2008 | Kim et al. | |
| 2013/0070509 A1 | 3/2013 | Gajapathy | |
| 2015/0120997 A1 | 4/2015 | Mitsubori et al. | |
| 2016/0071556 A1 | 3/2016 | Venkata et al. | |

\* cited by examiner

APPARATUSES AND METHODS FOR A MEMORY DEVICE WITH DUAL COMMON DATA I/O LINES

CROSS-REFERENCE TO RELATED APPLICATION(S)

This application is a continuation of U.S. patent application Ser. No. 15/400,653, filed Jan. 6, 2017, issued as U.S. Pat. No. 9,805,786 on Oct. 31, 2017. The afore-mentioned application and patent are incorporated by reference herein, in their entirety, and for all purposes.

BACKGROUND

Operating frequency of dynamic random-access memory (DRAM) has increased for each generation, and the data to be simultaneously accessed during memory access operations for a READ command or a WRITE command has also increased correspondingly with the operating frequency. In read operations, to achieve an "n"-times data rate, read data is typically accessed in "n" number of bits from DRAM arrays (e.g., prefetch) to a first in first out (FIFO) multiplexer (mux), which then undergoes a parallel-to-serial conversion in one column cycle. The number of bits provided by the memory cell array is referred to as the prefetch size. Thus, in this example, the prefetch size is "n."

In conventional devices, in order to realize a 16 times data rate, one option is to use a prefetch size of 16n. This, however, corresponds to a burst length of 16 data words, which is incompatible with a typical cache line size of 64 bytes utilizing a conventional 64-bit data bus. Alternatively, to realize the same data rate as a prefetch size of 16n while utilizing a conventional circuit structure for a prefetch size of 8n, the period of the column cycle must be halved (e.g. double the core speed), which may present challenges with circuit complexity and timing.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The following detailed description illustrates a few exemplary embodiments in further detail to enable one of skill in the art to practice such embodiments. The described examples are provided for illustrative purposes and are not intended to limit the scope of the invention. In the following description, for the purposes of explanation, numerous specific details are set forth in order to provide a thorough understanding of the described embodiments. It will be apparent to one skilled in the art, however, that other embodiments of the present invention may be practiced without some of these specific details.

Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

Unless otherwise indicated, all numbers herein used to express quantities, dimensions, and so forth, should be understood as being modified in all instances by the term "about." In this application, the use of the singular includes the plural unless specifically stated otherwise, and use of the terms "and" and "or" means "and/or" unless otherwise indicated. Moreover, the use of the term "including," as well as other forms, such as "includes" and "included," should be considered non-exclusive. Also, terms such as "element" or "component" encompass both elements and components comprising one unit and elements and components that comprise more than one unit, unless specifically stated otherwise.

Figure 1:
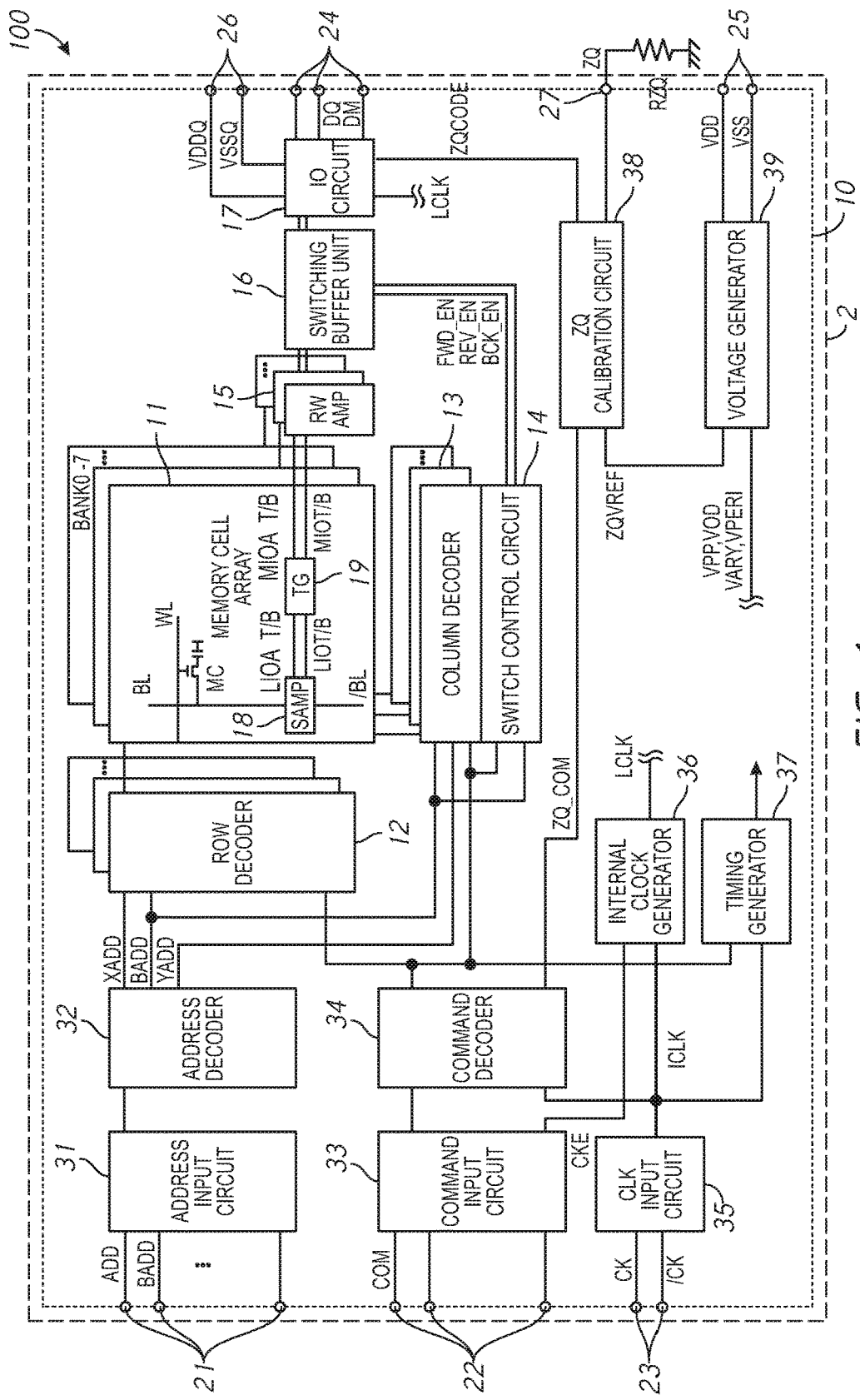
FIG. 1 is a schematic block diagram of an overall configuration of a semiconductor device, in accordance with various embodiments.

FIG. 1 is a schematic block diagram 100 of an overall configuration of a semiconductor device 10, in accordance with various embodiments. The semiconductor device 10 includes a switch control circuit 14 and a switching buffer unit 16, according to an embodiment of the present invention. In some embodiments, the semiconductor device 10 may include, without limitation, a DDR4 SDRAM integrated into a single semiconductor chip, for example. The semiconductor device 10 may be mounted on an external substrate 2, for example, a memory module substrate, a mother board or the like. The external substrate 2 employs an external resistor RZQ that is connected to a calibration terminal ZQ 27 of the semiconductor device 10. The external resistor RZQ is a reference impedance of a ZQ calibration circuit 38. In the present embodiment, the external resistor RZQ is coupled to a ground potential.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13.

Sense amplifiers 18 are located for their corresponding bit lines BL and connected to at least one respective local I/O line pair, which is in turn coupled to a respective one of at least two main I/O line pairs, via transfer gates TG 19, which function as switches. In some embodiments, the sense amplifier 18 may be coupled to a set of two local I/O line pairs, a first local I/O line pair having a first local I/O line LIOB_T and a second local I/O line LIOB_B, and a second local I/O line pair having a third local I/O line LIOA_T and fourth local I/O line LIOA_B. Local I/O line pairs LIOA_T/B and LIOB_T/B may be connected to two main IO line pairs, a first main I/O line MIOB_T, a second main I/O line MIOB_B, and a third main I/O line MIOA_T and fourth main I/O line MIOA_B.

Figure 2:
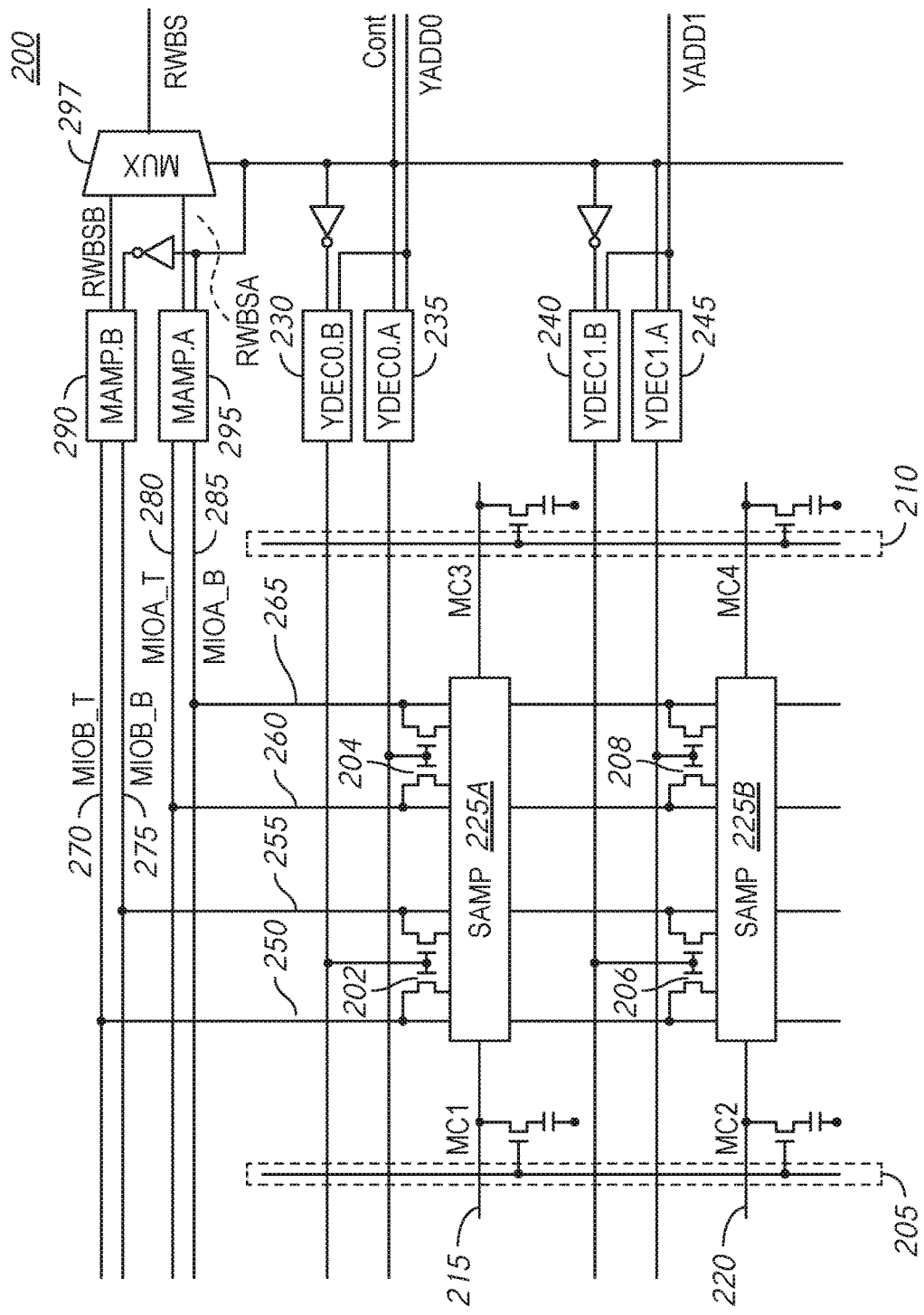
FIG. 2 is a schematic diagram of a portion of a memory cell array with dual I/O line pairs, in accordance with various embodiments.

In some embodiments, each pair of local I/O lines may be shared by adjacent bit lines, for example, with reference to FIG. 2, first column 215 corresponding to BL0_T/B, and second column 220 corresponding to BL1_T/B. Thus, bits stored in any one cell can be transmitted on any shared local I/O pair, such as LIOA_T/B or LIOB_T/B. In these embodiments, one or more column decoders (also referred to as "Y-decoder") may be provided for each shared sense amplifier. The one or more column decoders may be configured to switch the output of the sense amplifier between shared local I/O line pairs.

In other embodiments, each pair of local I/O lines may correspond to a respective adjacent bit line. For example, with reference to FIG. 3, first column 315 may be associated with the local I/O line pair LIOA_T/B 360, 365, which is in turn coupled to main I/O line pair MIOA_T/B 380, 385. Second column 320 BL1_T/B may be associated with the local I/O line pair LIOB_T/B 350, 355 and corresponding main I/O line pair MIOB_T/B 370, 375. Thus, in embodiments where local I/O line pairs are associated with a respective adjacent bit line, the local I/O line pairs may be referred to as exhibiting column interleaving, as consecutive local I/O line pairs may be coupled to adjacent bit lines in an alternating fashion. Further embodiments may include other associations between bit lines and local I/O line pairs, including, without limitation, associations of adjacent local I/O line pairs with respective non-adjacent bit lines.

The semiconductor device 10 employs a plurality of external terminals that include address terminals 21, command terminals 22, clock terminals 23, data terminals 24, power supply terminals 25 and 26, and the calibration terminal ZQ 27.

The address terminals 21 are supplied with an address signal ADD and a bank address signal BADD from outside. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12, the column decoder 13 and a switch control circuit 14.

The command terminals 22 are supplied with a command signal COM from outside. The command signal COM input to the command terminals 21 is input to a command decoder 34 via the command input circuit 33. The command decoder 34 decodes the command signal COM to generate various internal commands that include a row command signal to select a word line and a column command signal, such as a read command or a write command, to select a bit line, and a calibration signal ZQ_COM to the ZQ calibration circuit 38.

Accordingly, when the row command is issued with a row address and then the read command is issued with a column address, read data is read from a memory cell MC in the memory cell array 11 designated by these row address and column address. The read data DQ is output to outside from the data terminals 24 via a read/write amplifier 15, the switching buffer unit 16 and an input/output circuit 17. Similarly, when the row command is issued with a row address and then the write command is issued with a column address and write data DQ being supplied to the data terminals 24, the write data DQ is supplied via the input/output circuit 17, the switching buffer unit 16 and the read/write amplifier 15 to the memory cell array 11 and written in the memory cell MC designated by the row address and the column address.

By utilizing an architecture including at least one pair of local I/O lines per bit line and at least two pairs of main I/O lines, the semiconductor device 10 is able to achieve higher data transfer rates without 1) increasing burst length; and 2) relying on an increased memory core speed. A 2n times data output rates can be realized by using the pairs of local I/O and main I/O lines concurrently each column cycle.

In some embodiments, DRAM internal data buses, including each pair of local I/O line pairs and associated main I/O line pairs, are independent of each other. Thus, a first read operation can be started on a first set of local I/O line pairs and main I/O line pairs, and a subsequent read operation may be started on another set of local 170 line pairs and main I/O line pairs before the first read operation is completed. Therefore, when data is required to be output continuously, a data rate of 2n times the column cycle is realized by issuing a second column command after a half-column cycle has elapsed after the first column command. In this manner, a 16n data rate may be realized with an 8n prefetch each half-column cycle. It is to be understood that in other embodiments, other prefetch sizes may be utilized. For example, in one embodiment, a 16n prefetch may be implemented every half-column cycle to effectively achieve a data transfer rate associated with a 32n prefetch. In other embodiments, smaller or larger prefetch sizes may be used as appropriate.

In further embodiments, it will be appreciated that the bit lines need not necessarily be consecutive. In embodiments where the column decoder may select between two adjacent local I/O line pairs, any other column address may be read from in the second half of the column cycle. However, in embodiments implementing column interleaving, if an even numbered bit line is read in the first half of a column cycle, an odd numbered bit line may be read in the second half of the column cycle. Similarly, if an odd numbered bit line is read in the first half of a column cycle, an even numbered bit line may be read in the second half of the column cycle.

The switch control circuit 14 is a circuit in which switch control signals including "Fwd_en", "Rev_en" and "Bck_en" are generated responsive to the hank address signal BADD and the column command signal. Once the switch control circuit 14 receives the bank address signal BADD and the column command signal indicative of a read command is received, the switch control circuit generates these switch control signals at respective timings such that switch control signals are provided to be overlapped with each other. These switch control signals are provided to the switching buffer unit 16 and used in activating one data path route among a plurality of data path routes. The switching buffer unit 16 includes a data path. The data path includes data busses and further includes switching buffer circuits. The data busses include data bus segments coupled to the switching buffer circuits. The data path is coupled to data terminals and a plurality of memory banks. The switching buffer circuits drive data from one side associated with a first data bus segment where the data is currently transmitted to another side associated with a second data bus segment where the data is to be transmitted next based on the received switch control signals, such as "Fwd_en", "Rev_en" and "Bck_en", indicative of data flow directions to be controlled, and stop driving data once the data is transmitted to the other side. The details of the switching buffer unit 16 are described later.

Turning to the explanation of the external terminals included in the semiconductor device 10, the clock terminals 23 are supplied with external clock signals CK and /CK, respectively. The external clock signals CK and /CK may be complementary to each other and are supplied to a clock input circuit 35. For example, in some embodiments, CK and /CK may have an inverse relationship relative to each other. The clock input circuit 35 receives the external clock signals CK and /CK to generate an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal voltage generating circuit 39. The internal power supply generating circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ are the same potentials as the power supply potentials VDD and VSS that are supplied to the power supply terminals 25, respectively. However, the dedicated power supply potentials VDDQ and VSSQ are used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17, and thus an impedance of an output buffer (not shown) included in the input/output circuit 17 is specified.

FIG. 2 illustrates a portion of the memory cell array 200, 11 utilizing dual I/O line pairs, in accordance with various embodiments. For purposes of conceptual understanding, the memory cell array 200 has been simplified to depict only two word lines, a first word line 205 and a second word line 210. The word lines 205, 210 are coupled to the gates of the memory cells MC1-MC4, which are in turn coupled (e.g. at a source terminal) to a first bit line 215 and a second bit line 220, respectively. A first memory cell MC1 may be located at the intersection of the first bit line 215 and the first word line 205, a second memory cell MC2 may be located at the intersection of the second bit line 220 and the first word line 205, a third memory cell MC3 may be located at the intersection of a third bit line 225 and the second word line 210, and a fourth memory cell MC4 may be located at the intersection of a fourth bit line 230 and the second word line 210. The first and third memory cells MC1, MC3 are coupled to a first sense amplifier 225A. The second and fourth memory cells MC2, MC4 are coupled to a second sense amplifier 225B. Each sense amplifier 225A, 225B (collectively is coupled, via a transfer gate, to two local I/O line pairs. For example, a first transfer gate 202 may couple the first sense amplifier 225A to a first local I/O line pair including LIOB_T 250 and LIOB_B 255, and a third transfer gate 206 may couple the second sense amplifier 225B to the first local I/O line pair. A second local I/O line pair may include LIOA_T 260 and LIOA_B 265, which may be coupled to the first sense amp 225A via a second transfer gate 204, and to the second sense amp 225B via a fourth transfer gate 208. Thus, the first local I/O line pair may be coupled to a first main I/O line pair including MIOB_T 270 and MIOB_B 275. Similarly, the second local I/O line pair may be coupled to a second main I/O line pair including MIOA_T 280 and MIOA_B 285.

In operation, when the first word line 205 is activated and data is read from a first bit line 215, which is coupled to corresponding to memory cells MC1, MC3, the column decoders YDEC0.B 230 and YDEC0.A 235, may close and open corresponding switches coupling sense amplifier 225A to the local I/O line pairs. Data may be output via a main I/O line pair corresponding to the local I/O line pair selected by the column decoders YDEC0.B 230 and YDEC0.A 235. Subsequently, data may be read from an adjacent bit line, such as second bit line 220 corresponding to memory cells MC2 and MC4. When data is read from the second bit line 220, column decoders YDEC1.B 240 and YDEC1.A 245, may close and open respective switches coupling sense amplifier 225B to the local I/O line pairs such that data is output to a local I/O line pair that was not selected by YDEC0.B 230 and YDEC0.A 235.

For example, in one embodiment, data from the first bit line 215 may be output on the first local I/O pair LIOB_T 250 and LIOB_B 255. Accordingly, YDEC0.B 230 may cause an associated transfer gate to become conductive, causing sense amplifier 225A to output data from bit line 215 to the first local I/O pair LIOB_T 250 and LIOB_B255. YDEC0.A 235 may cause its associated transfer gate to become non-conductive, thus preventing sense amplifier 225A from outputting data to a second local I/O pair LIOA_T 260 and LIOA_B 265. Data may then be read from the second bit line 220. Thus. YDEC1.B 240 may cause its associated transfer gate to become nonconductive, and YDEC1.A 245 may cause its associated transfer gate to become conductive. In this manner, sense amplifier 225B may output data from the second bit line 220 to be output to the second local I/O line pair LIOA_T 260 and LIOA_B 265 while being prevented from outputting the data on the first local I/O line pair.

In some embodiments, the first local I/O line pair and first main I/O line pair may collectively form a first common data I/O line pair for a given memory cell array 200. Similarly, the second local I/O line pair and second main I/O line pair may collectively form a second common data I/O line pair for a respective memory cell array 200.

Figure 4:
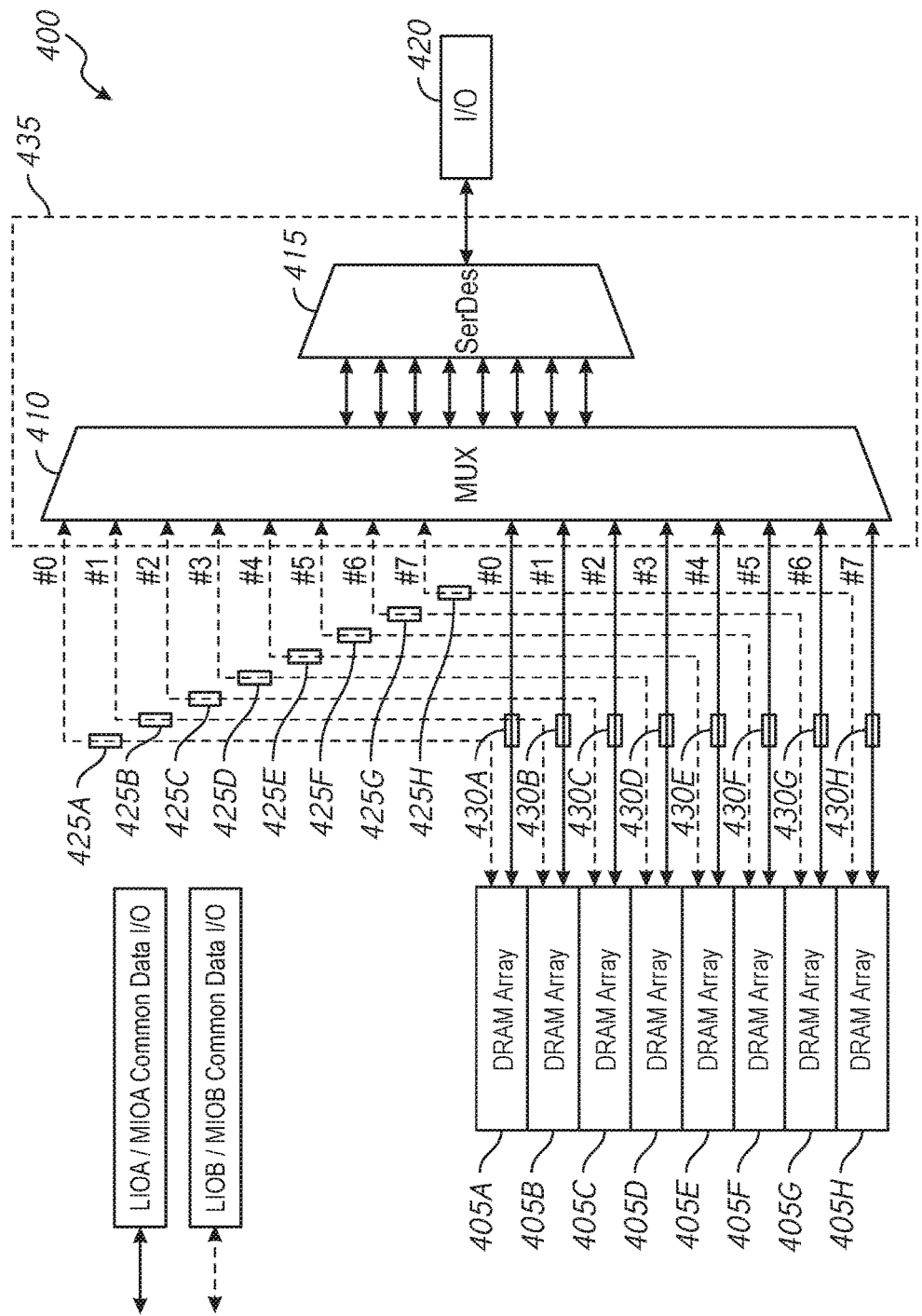
FIG. 4 is a block diagram of dual I/O line pair read/write architecture, in accordance with various embodiments.

With reference to FIG. 4, in some embodiments, the memory cell array 200 of FIG. 2 may correspond to individual DRAM arrays 405A-405H. The first main I/O line pair may correspond to the dashed line. In some embodiments, the dashed line may further include the first local I/O line pair, LIOB, of an individual DRAM array 405A-405H as connected to a respective data line of the first main I/O line pair, MIOB. The second main I/O line pair may correspond to the solid line. In some embodiments, the solid line may also include the second local I/O line pair, LIOA, of an individual DRAM array 405A-405H as connected with a respective data line of the second main I/O line pair, MIOA.

The transfer gates 202, 204, 206, 208, coupling each of the sense amplifiers 225 to a respective local I/O line pair, may be controlled by respective Y-decoders. For example, Y-decoders YDEC0.B 230 and YDEC0.A 235 may be associated with the transfer gates of sense amplifier 225A. Y-decoders YDEC1.B 240 and YDEC1.A 245 may be associated with the transfer gates of sense amplifier 225B. Sense amplifier 225A may include a first transfer gate coupled to YDEC0.B 230, and further coupling sense amplifier 225A to the first local I/O line pair LIOB_T 250 and LIOB_B 255. The second transfer gate may be coupled to YDEC0.A 235, and further coupling sense amplifier 225A to the second local I/O line pair LIOA_T 260 and LIOA_B 265. When YDEC0.B 230 is active (e.g., outputting a high level), the first transfer gate may become conductive. When YDEC0.B 230 is inactive (e.g., outputting a low level), the first transfer gate may become nonconductive. Similarly, when YDEC0.A 235 is active, the second transfer gate may become conductive, and when YDEC0.A 235 is inactive, the second transfer gate may become nonconductive. In some embodiments, YDEC0.A 235 and YDEC0.B 230 may be configured to such that when one is activated, the other is deactivated. Thus, when Y-decoders YDEC0.A 230 and YDEC0.B 235 may be configured to select between local I/O line pairs.

This configuration may be reflected with respect to sense amplifier 225B. Sense amplifier 225B may include a third and fourth transfer gates, the third transfer gate coupled to Y-decoder YDEC1.B 240, and the fourth transfer gate coupled to Y-decoder YDEC1.A 245. The third transfer gate may couple sense amplifier 225B to the first local I/O line pair, and the fourth transfer gate may couple sense amplifier 225B to the second local I/O line pair. As described above with respect to sense amplifier 225A, YDEC1.B 240 and YDEC1.A 245 may be configured to respectively select between local I/O line pairs by opening and closing the third and fourth transfer gates respectively.

In some embodiments, a first bit may be output onto the first main I/O line pair MIOB_T 270 and MIOB_B 275. In one embodiment, the data word may be 8-bits wide. Thus, in some embodiments, a first prefetch of 8-bits may be output to the first main amplifier MAMP.B 290 from each respective first main I/O line pair of each DRAM array (e.g., 8 DRAM arrays each with a respective first main I/O line pair). In such embodiments, MAMP.B 290 may in turn be configured to output the first data word, via a first read/write bus RWBSB, to multiplexer 297. In some embodiments, the multiplexer 297 may be configured to perform parallel to serial conversion. For example, for an 8-bit data word, a first bit from a first bank may correspond to bit position 0, a second bit from a second bank correspond to bit position 1, and so on and so forth. The multiplexer 297 may then output, in FIFO order, the bits from bit position 0 through bit position 7.

In some embodiments, the control signal "Cont" may be configured to activate, alternately, YDEC0.B, YDEC1.B 230, 240 and YDEC0.A, YDEC0.A 235, 245 respectively, based on a high or low signal. Similarly, main amplifiers MAMP.B 290 and MAMP.A 295 may also be configured to be enabled in a complementary manner, based on the Cont signal. Thus, in some embodiments, Cont may be a local I/O line pair and/or main I/O line pair selection signal. For example, in some embodiments, input signals YADD0 and YADD1 may, in some embodiments, indicated two different column addresses. In other embodiments, a single column address may be provided, based on which a range of proximate columns may also be accessed. In some further embodiments, given YADD0 and YADD1, the control signal "Cont" may be used to select between local and main I/O line pairs.

In some embodiments, while the first data word undergoes parallel to serial conversion, during a second half-column cycle, a second data word may be accessed from another column. Thus, a second bit of a second data word may be output to the second main I/O line pair MIOA_T 280 and MIOA_B 285. The second main I/O line pair may in turn be coupled to a second main amplifier MAMP.A. 295, which is further coupled to the multiplexer 297 via a second read/write bus RWBSA. As previously described, in some embodiments, MAMP.A 295 may be configured to receive all 8-bits of the second data word from each respective second main I/O line pair of each DRAM array (e.g., 8 DRAM arrays each with a respective second main I/O line pair). The multiplexer may be configured to perform parallel to serial conversion of data from the MAMP.A 295. In some embodiments, the multiplexer 297 may be configured to select between the first data word and the second data word, and further output the selected data word to a parallel-serial converter, such as, without limitation, another multiplexer. In some further embodiments, MAMP.A. 295 and MAMP.B 290 may be configured such that when one main amplifier is enabled, the other is disabled. In this manner, because the first main I/O line pair and the second main I/O line pair are largely independent, a second 8n prefetch may be executed before a first 8n prefetch has been completed.

Figure 3:
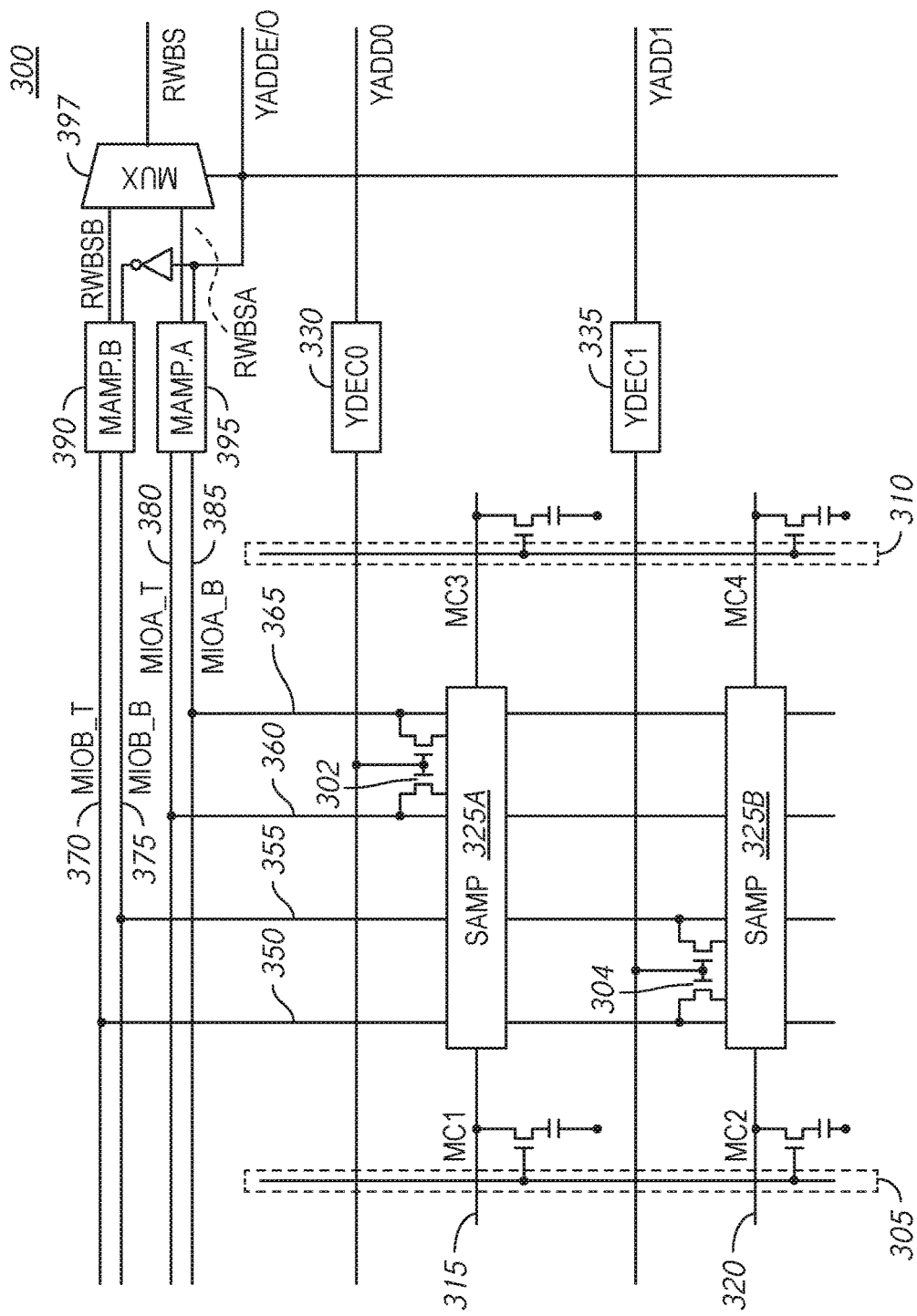
FIG. 3 is a schematic diagram of a portion of an alternative memory cell array with dual I/O line pairs, in accordance with various embodiments.

FIG. 3 illustrates a portion of a memory cell array 300 having an alternative arrangement of the dual I/O line pairs, in accordance with various embodiments. As in FIG. 2, for purposes of conceptual understanding, the memory cell array 300 has been simplified to depict only two word lines, a first word line 305 and second word line 310. As previously described, each of the word lines 305, 310 may be coupled to the gates of the memory cells MC1-MC4, which are in turn coupled to a first bit line 315 and a second bit line 320, respectively. The memory cell MC1 may be located at the intersection of the first bit line 315 and the first word line 305, with the gate of MC1 coupled to the first word line 305, and the source terminal of MC1 coupled to the first bit line 315. Similarly, the second memory cell MC2 may be located at the intersection of the second bit line 320 and the first word line 305. The third memory cell MC3 may be located at the intersection of the first bit line 315 and the second word line 310, and the fourth memory cell MC4 may be located at the intersection of the second bit line 320 and the second word line 310. Memory cells MC1 and MC3 may be coupled to a first sense amplifier 325A of bit line 315. Memory cells MC2 and MC4 may be coupled to a second sense amplifier 325B of bit line 320. Each sense amplifier 325A, 325B (collectively 325) is coupled, via a transfer gate, to two local I/O line pairs. A first local I/O line pair may include LIOB_T 350 and LIOB_B 355. A second local I/O line pair may include LIOA_T 360 and LIOA_B 365. The first local I/O line pair may be coupled to a first main I/O line pair including MIOB_T 370 and MIOB_B 375. The second local I/O line pair may be coupled to a second main I/O line pair including MIOA_T 380 and MIOA_B 385. In some embodiments, the first local I/O line pair and first main I/O line pair may collectively form a first common data I/O line pair for a given memory cell array 300. Similarly, the second local I/O line pair and second main I/O line pair may collectively form a second common data I/O line pair for a respective memory cell array 300.

In contrast with FIG. 2, however, the transfer gate 302 couples sense amp 325A to only the second local I/O line pair. Similarly, sense amp 325B is coupled, via transfer gate 304, only to the first local I/O line pair. Accordingly, the first bit line 315 is associated with the second local and second main I/O line pair, but not the first local and first main I/O line pair. The second bit line 320 is associated with the first local and first main I/O line pair, but not the second local and second main I/O line pair.

Figure 7:
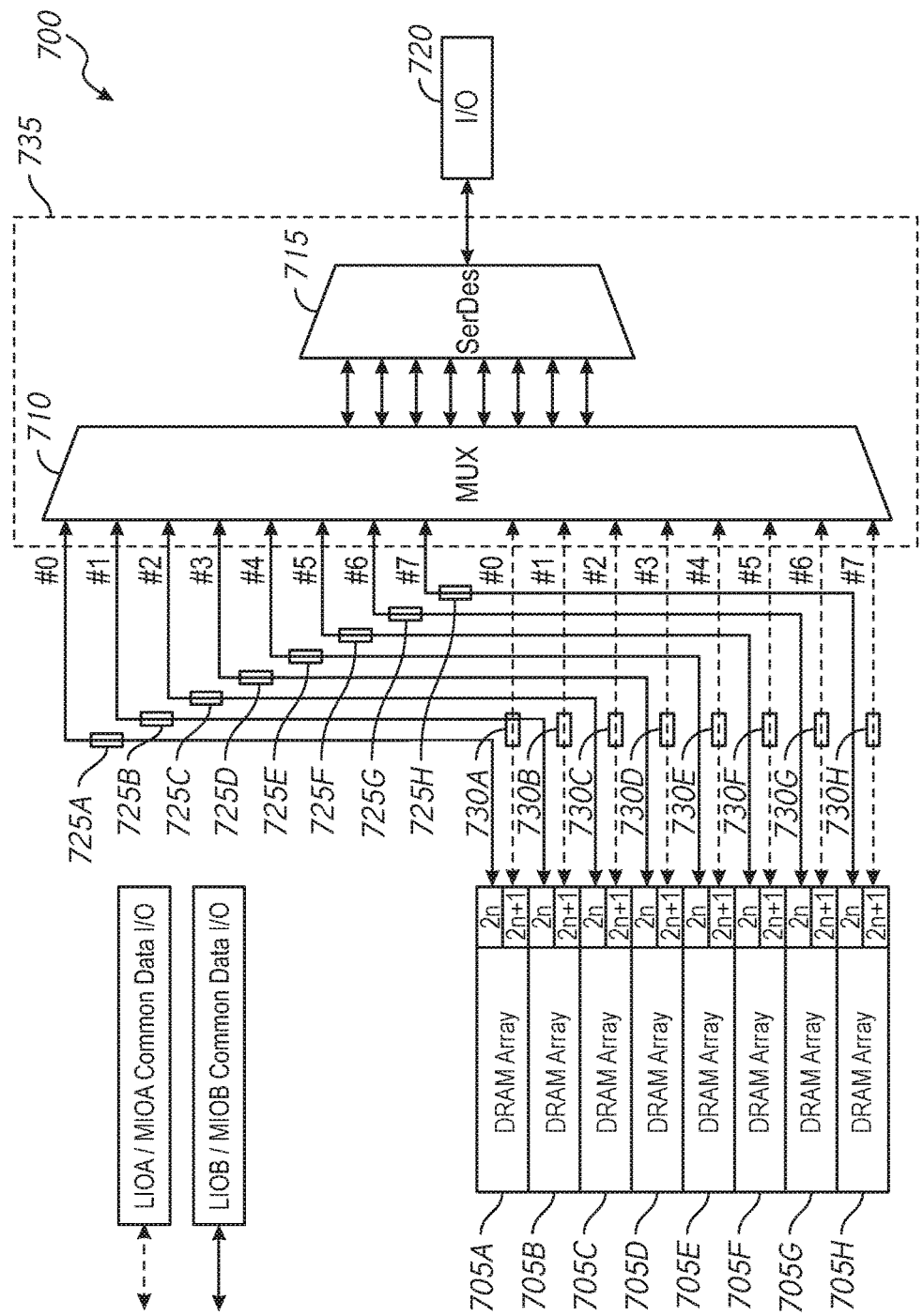
FIG. 7 is a block diagram of an alternative dual I/O line pairs read/write architecture, in accordance with various embodiments.

With reference to FIG. 7, in some embodiments, the memory cell array 300 of FIG. 3 may correspond to an individual DRAM array 705A-705H. Here, the first main I/O line pair may correspond to the solid line whereas the second main I/O line pair may correspond to the dashed line. In some embodiments, the solid line may represent the first local I/O line pair, LIOB, of an individual DRAM array 705A-705H connected to a respective data line of the first main I/O line pair, MIOB. The second main I/O line pair may correspond to the dashed line. In some embodiments, the dashed line may represent the second local I/O line pair, LIOA, of an individual DRAM array 705A-705H as connected with a respective data line of the second main I/O line pair, MIOA. In some embodiments, each of the DRAM arrays 705A-705H may include multiple local I/O line pairs, each of the local I/O line pairs being coupled to a single data line of a respective main I/O line pair.

Y-decoder YDEC0 330, thus, may be configured only to activate or deactivate the transfer gate for bit line 315, and YDEC1 335 is configured only to activate or deactivate the transfer gate for bit line 320. When YDEC0 330 is active, the transfer gate for sense amplifier 325A may become conductive. When YDEC0 330 is inactive, the transfer gate of sense amplifier 325A may become nonconductive. Similarly, when YDEC1 335 is active, the transfer gate of sense amplifier 325B may become conductive, and when YDEC1 335 is inactive, the transfer gate of sense amplifier 325B may become nonconductive. In some embodiments, YDEC0 330 may be configured to be active when YDEC1 335 is inactive and inactive when YDEC1 335 is active.

Given this arrangement, data output to the respective main I/O line pairs exhibits column interleaving. For example, if the first main I/O line pair MIOB_T 370 and MIOB_B 375 is associated with odd-numbered bit lines, the second main I/O line pair MIOA_T 380 and MIOA_B 385 must be associated with even-numbered bit lines, and vice versa, if the first main I/O line pair is associated with even-numbered bit lines, the second main I/O line pair must be associated with odd-numbered bit lines. In some cases, the bit lines may be consecutive, but in other embodiments, the bit lines need not be consecutive as long as they exhibit the aforementioned even-odd relationship. For example, bit line 315 may be bit-line number 2n, whereas bit line 320 may be bit-line number 2n+1.

In some embodiments, a first bit of a data word may be output onto the first main I/O line pair MIOB_T 370 and MIOB_B 375. In one embodiment, the data word may be 8-bits wide. Thus, in some embodiments, a first read access may output 8-bits to the main amplifier MAMP.B 390 from each respective first main I/O line pair of each DRAM array (e.g., 8 DRAM arrays each with a respective first main I/O line pair). MAMP.B 390 may in turn be configured to output the first data word, via a first read/write bus RWBSB, to multiplexer 397. Further description of the multiplexer 397 has been excluded in the interest of a concise description. However, it is to be understood the multiplexer 397 may be configured to have similar structures, and function similarly to the multiplexer 297 previously described with respect to FIG. 2. In some embodiments, while the first data word undergoes parallel to serial conversion, during a second half-column cycle, a second bit of a second data word may be accessed from another adjacent column, or an even/odd complement to the first column 315. Thus, the bits of the second data word may be output to a respective second main I/O line pair MIOA_T 380 and MIOB_B 385. As previously described, each respective second main I/O line pair of each respective DRAM array may in turn be coupled to a second main amplifier MAMP.A 395, which is further coupled to the multiplexer 397 via a second read/write bus RWBSA. In some embodiments, a control signal, YADDE/O, may be provided to indicate whether a column address input with a column command corresponds to an even or an odd bit line.

FIG. 4 is a schematic block diagram of dual I/O line read/write architecture for a semiconductor device 400, according to various embodiments. In some embodiments, the semiconductor device 400 may include DRAM Arrays 405A-405H (collectively 405), multiplexer 410, parallel-serial converter (Serializer/De-serializer) 415, and data I/O 420. In the embodiments depicted by FIG. 4, each DRAM array 405 may have an architecture corresponding to memory cell array 200 of FIG. 2, in which bit line selection is not restricted between even and odd bit lines. As previously described, each of the DRAM arrays 405 may respectively include a first local I/O line pair associated with a first main I/O line pair, and a second local I/O line pair associated with a second main I/O line pair. In some embodiments, the first local I/O line pair and associated first main I/O line pair may collectively form a first common data I/O line pair for an individual DRAM array 405A-405H. The second local I/O line pair and associated second main I/O line pair may collectively form a second common data I/O for each respective DRAM array 405A-405H. Thus each individual DRAM array 405A-405H may include both a first common data I/O and a second common data I/O line pair. The first common data I/O line pair is depicted as a dashed line, and the second common data I/O line pair is depicted as a solid line.

In some embodiments, the multiplexer 410 may be configured to receive a parallel input consistent, with the width of a data word, for example 8-bits, from each of the first common data I/O line pairs, the bit from the first DRAM array 405A corresponding to the first bit position, the bit from the second DRAM array 405B corresponding to the second bit position, and so on. Similarly, data from each of the second common data I/O line pairs may be received by the multiplexer 410 as a second parallel input having the width of the data word, in this example, 8-bits. The multiplexer 410 may be configured to select between the newer of the first 8-bits and the second 8-bits to output to the parallel-serial converter 415. The parallel-serial converter 415 may provide a serial output of the 8-bit input in sequence from lowest bit-position to highest bit-position as in a FIFO ordering. The data I/O 420 may then carry the data serially to an external requesting source. In some embodiments, the multiplexer 410 and parallel-serial converter 415 may comprise a single multiplexer 435 to receive two 8-bit wide inputs and select between each of the two 8-bit wide inputs, as described with respect to multiplexer 410, and output the selected 8-bit input serially to the data I/O 420, consistent with the description of parallel-serial converter 415.

A first read/write amplifier 425A-425H (collectively 425) may be provided on each of the first main I/O line pairs, between multiplexer 410 and each respective DRAM array 405. In some embodiments, the first read/write amplifiers 425 may be bi-directional amplifiers, such as, for example, main amplifier MAMP.B 290, as described with respect to FIG. 2. Similarly, a second read/write amplifier 430A-H (collectively 430) may be provided on each of the second main I/O line pairs, between each respective DRAM array 405 and multiplexer 410, the second read/write amplifiers 430 corresponding to main amplifier MAMP.A 295.

Figure 5:
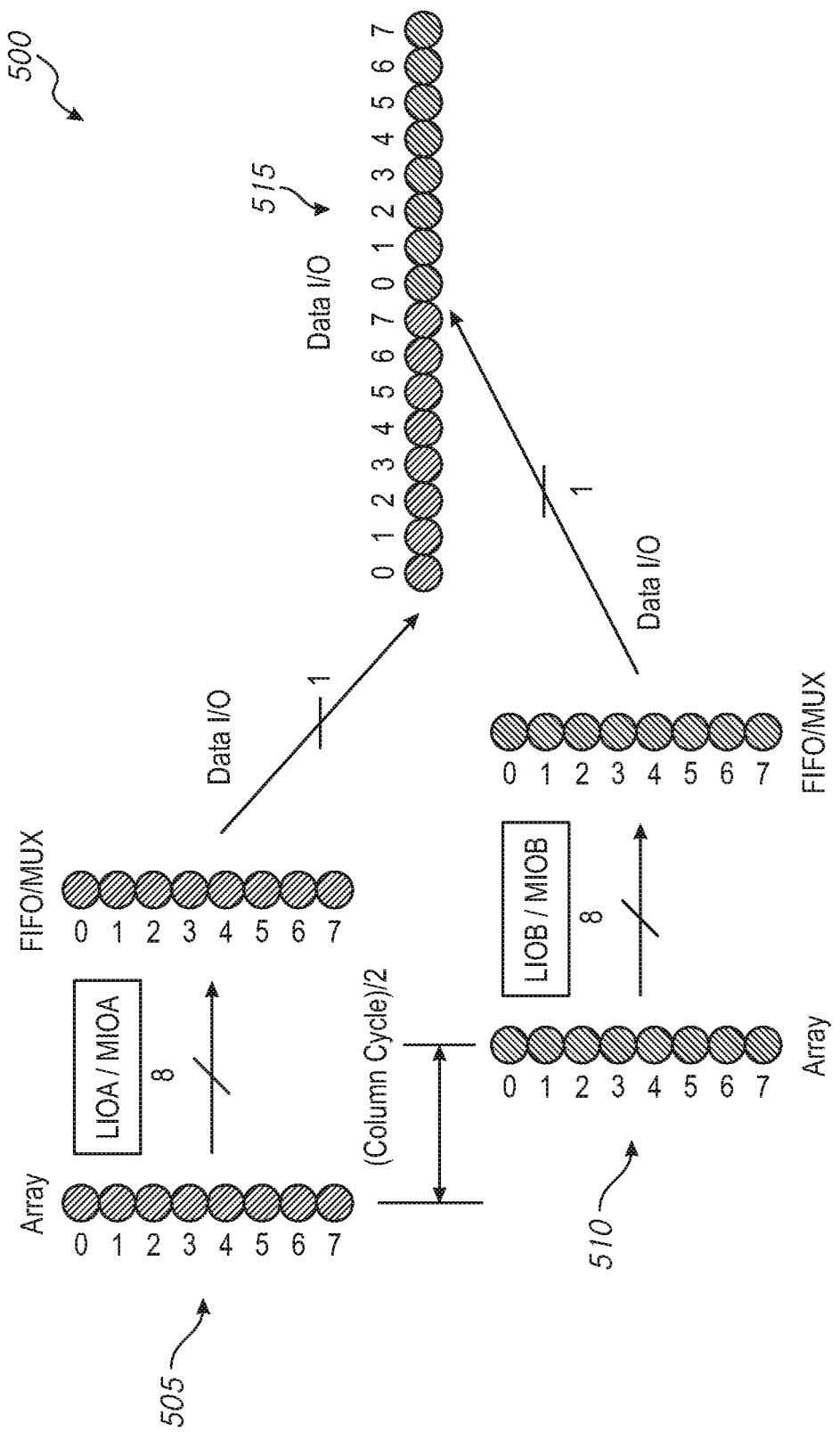
FIG. 5 is a schematic diagram of a read operation with 8n prefetch utilizing dual I/O line pairs, in accordance with various embodiments.

With reference to FIG. 5, the relationship between the first 8n prefetch and subsequent 8n prefetch may be better understood. FIG. 5 is a schematic diagram 500 of a read operation with 8n prefetch utilizing dual I/O line pairs, in accordance with various embodiments. In some embodiments, a column command may be received, and column data accessed. The column data may then be output to a local I/O line pair and associated main I/O line pair LIOA/MIOA. In the depicted embodiment, the prefetched first data word 505 may be 8-bits in size, and transmitted via an 8-bit wide first LIOA/MIOA line pairs to the FIFO/MUX. A half column-cycle later, a second data word 510 may be fetched, as described above, via a second LIOB/MIOB line pairs. Thus, as the FIFO/MUX completes parallel to serial conversion, transferring the data serially to a data I/O buffer 515, LIOB/MIOB may provide the second data word 510 to the FIFO/MUX for parallel-serial conversion. Thus, an 8n size prefetch may be accessed and read every half-column cycle, utilizing largely independent LIOA/MIOA and LIOB/MIOB line pairs to concurrently access data before a read operation is completed. In other words, the LIOA/MIOA line pairs may provide data from a first bit line concurrently with LIOB/MIOB line pairs providing data from a second bit line. For example, in one embodiment, each LIOA/MIOA line pair may provide one bit from the first bit line during the same single column cycle that each LIOB/MIOB line pair provides another bit from the second bit line. Thus, in some examples, data that is provided concurrently on LIOA/MIOA line pairs and LIOB/MIOB line pairs may include data that is provided on consecutive half-column cycles of a single column cycle used in a conventional DRAM. Moreover, in some embodiments, data may be provided by the LIOB/MIOB line pair before a read operation for data on the LIOA/MIOA line pair has completed, and vice versa, data may be provided by LIOA/MIOA line pairs before a read operation for data on the LIOB/MIOB line pairs has completed. In further embodiments, similar operation may be supported in the write direction, where data may be written into the memory cell array every half-column cycle, utilizing two sets of LIOA/MIOA and LIOB/MIOB line pairs.

Figure 6:
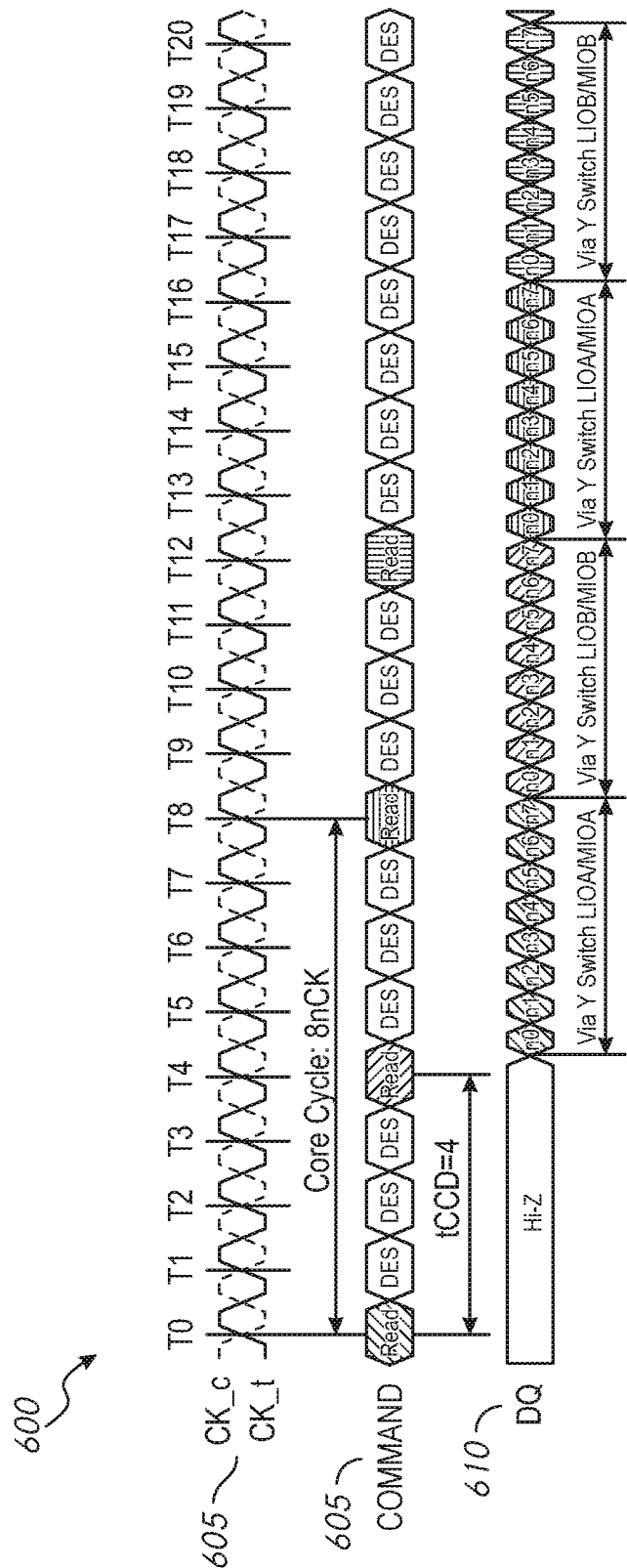
FIG. 6 is a timing diagram of a read operation utilizing dual I/O line pairs, in accordance with various embodiments.

FIG. 6 is a timing diagram 600 of a read operation utilizing dual I/O line pairs, in accordance with various embodiments. The timing diagram includes clock signals 605 CK_t and its complement, CK_c, command signals 605, and data signals DQ 610. In the depicted embodiment, utilizing an 8n prefetch size, one cycle of the core clock (e.g. column cycle) is equivalent to 8nCK. In a traditional configuration, the column to column burst delay, tCCD(Min), would be equal to 8nCK. However, as shown, by utilizing two sets of local I/O line pairs and main I/O line pairs, a tCCD(Min) of 4nCK can be realized, or roughly half of the core clock cycle (e.g. column cycle).

Thus, for example, a read command may be issued at T0. The subsequent times T1, T2, and T3 may be spent retrieving and converting the read data. A half-column cycle later, at T4, a second read command may be issued. Meanwhile, shortly after or concurrently with the second read command, the serialized data from a first set of LIO/MIO line pairs e.g. first common data I/O line pair), may be output on serial data I/O DQ 610. Another half-column cycle later, at T8, a third read command is issued for the first set of LIO/MIO line pairs, while shortly after read data from the second read command is output on the serial I/O DQ 610 from a second set of LIO/MIO line pairs. Thus, every column cycle, two 8n prefetches may be completed, effectively achieving the data rate of a 16n prefetch.

By reducing tCCD by half, a memory controller may be able to issue column commands for half the amount data in half of normal intervals. Thus, even if smaller prefetch sizes are used, and the data rate stays unchanged, the controller is able to frequently access the memory with greater flexibility as to the data targeted. Because the burst length is reduced, data may be read from memory more efficiently. Moreover, the duration between memory accesses may be shortened (e.g. halved) as well.

FIG. 7 is a schematic block diagram of and alternative dual I/O line pair read/write architecture for a semiconductor device 700, in accordance with various embodiments. Additional discussion of features already described above, with respect to FIG. 4, has been omitted for clarity and conciseness. The semiconductor device 700 may include DRAM Arrays 705A-705H (collectively 705), multiplexer 710, parallel-serial converter (Serializer/De-Serializer) 715, and data I/O 720. In the embodiments depicted by FIG. 7, each DRAM array 705 has an architecture corresponding to a memory cell array 300 of FIG. 3. As previously described, each of the DRAM arrays 705 may respectively include a first local I/O line pair associated with a first main I/O line pair, and a second local I/O line pair associated with a second main I/O line pair. In some embodiments, the first local I/O line pair and associated first main I/O line pair may collectively form a first common data I/O line pair for an individual DRAM array 705A-705H. The second local I/O line pair and associated second main I/O line pair may collectively form a second common data I/O line pair for each respective DRAM array 705A-705H. Thus each individual DRAM array 705A-705H may include both a first common data I/O line pair and a second common data I/O line pair. The first common data I/O line pair is depicted as a dashed line, and the second common data I/O line pair is depicted as a solid line.

Similar to FIG. 4, in some embodiments, the multiplexer 710 and parallel-serial converter 715 may comprise a single multiplexer 735. Furthermore, a first read/write amplifier 725A-725H (collectively 725) may be provided on each of the first main I/O line pairs, between multiplexer 710 and each respective DRAM array 705. In some embodiments, the first read/write amplifiers 725 may be bi-directional amplifiers, such as, for example, main amplifiers MAMP.B 390, as described with respect to FIG. 3. Similarly, a second read/mite amplifier 730A-H (collectively 730) may be provided on each of the second main I/O line pairs, between each respective DRAM array 705 and multiplexer 710.

In contrast with FIG. 4, however, in some embodiments, the first common data I/O line pair may be configured to only access data on odd numbered bit-lines, while the second common data I/O line pair may be configured to only access data on even numbered bit-lines. In some embodiments, the second common data I/O line pair may be associated with a first bit line. The first common data I/O line pair may then be associated with an adjacent bit line to the first bit line. In other embodiments, the first common data I/O line pair may be associated with any non-adjacent bit line that is an even/odd complement to the first bit line. In other embodiments, it is to be understood that the first common data I/O line pair may be configured to only access data on even numbered bit lines, while the second common data I/O line pair may be configured to access data on odd numbered bit lines.

In embodiments where the first common data I/O line pair is configured to access only data on odd-numbered bit lines, the second common data I/O line pair may be configured to access only data in even-numbered bit lines. Conversely, in embodiments having the first common data I/O line pair configured to access only data on even-numbered bit lines, the second common data I/O line pair may be configured to access only data in odd-numbered bit lines. Accordingly, column interleaving may be provided by the first common data I/O line pair, and the second common data I/O line pair, being alternatingly coupled to even and odd numbered bit lines.

Figure 8:
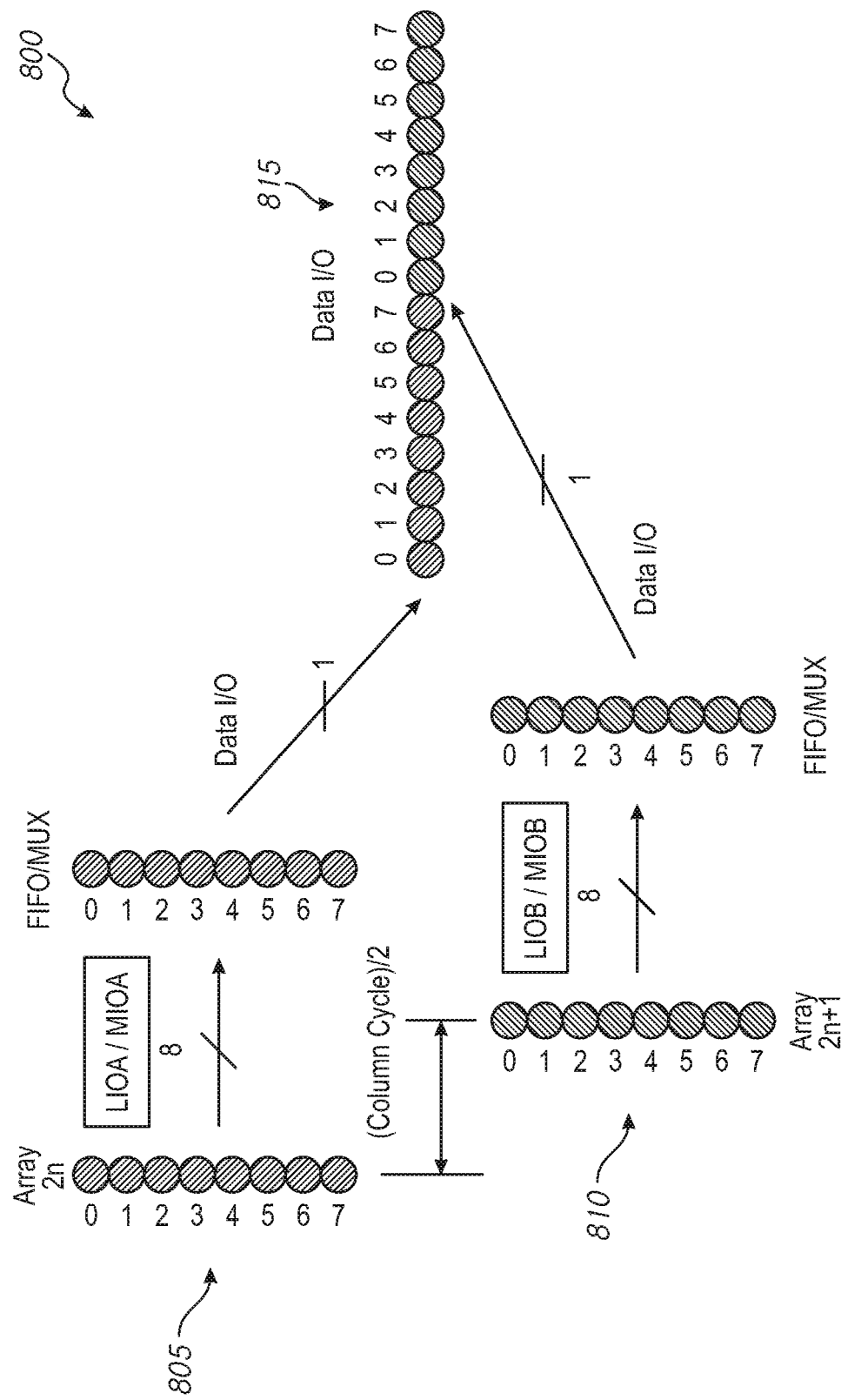
FIG. 8 is a schematic diagram of a read operation with 8n prefetch utilizing the alternative dual I/O line pair configuration, in accordance with various embodiments.

FIG. 8 is a schematic diagram 800 of a read operation with 8n prefetch utilizing column interleaved dual I/O line pairs, in accordance with various embodiments. As already described with respect to FIG. 5, repetitive features have been omitted from this description. In contrast with FIG. 5, however, the prefetched first data word 805 includes data from only an even-numbered bit line 2n. The second data word 510, then, includes data from only an odd-numbered bit line 2n+1. In some embodiments, the odd-numbered bit line 2n+1 may be an adjacent bit line to bit line 2n, but in other embodiments, bit line 2n+1 may not need to be adjacent to bit line 2n.

Figure 9:
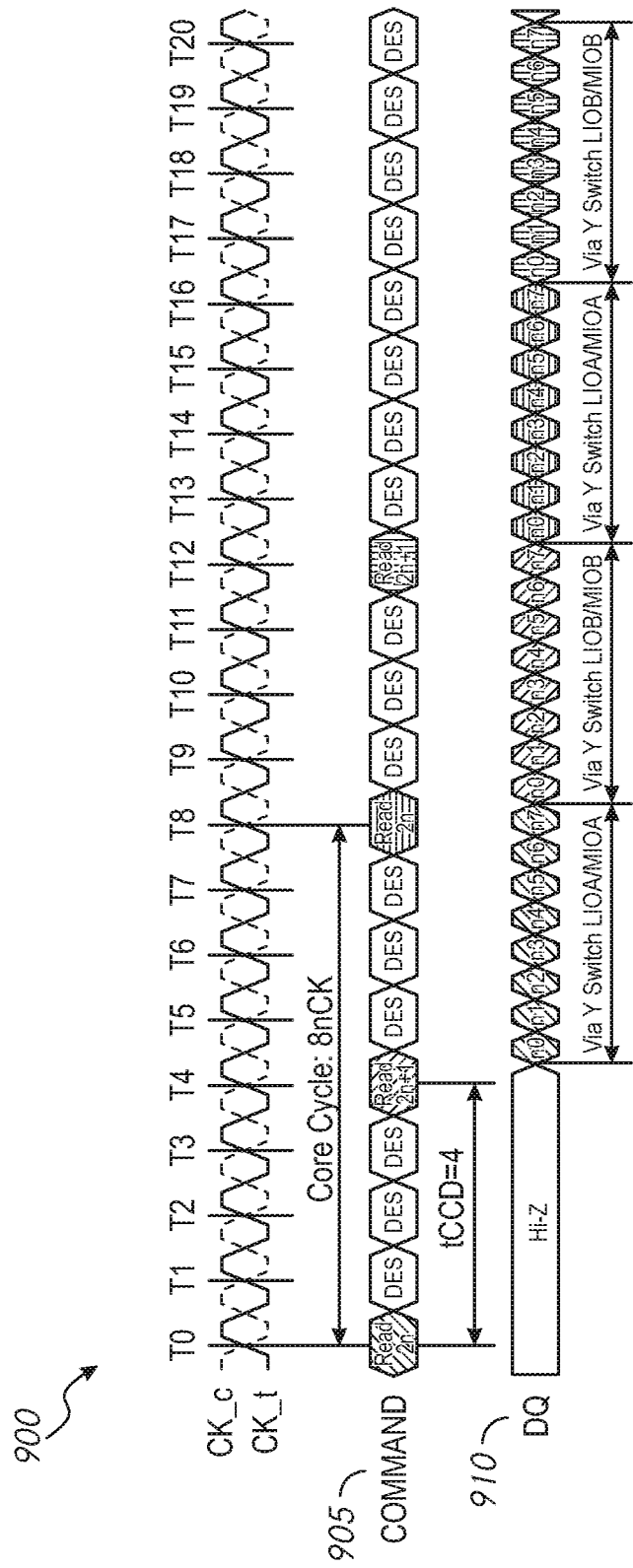
FIG. 9 is a timing diagram of a read operation utilizing the alternative dual I/O line pair configuration, in accordance with various embodiments.

FIG. 9 is a timing diagram 900 of a read operation utilizing dual I/O line pairs, in accordance with various embodiments. FIG. 9 exhibits many of the same features as FIG. 6, which will be omitted for clarity and conciseness. In contrast with FIG. 6, however, when a first read command is issued at T0, the read command is for an even numbered bit line. A half-column cycle later, at T4, a second read command is issued, but this time for an odd numbered bit-line. Another half-column cycle later, at T8, a third read command is issued for an even-numbered bit line. Thus, in some embodiments, each read command alternates between even and odd numbered bit lines, or, alternatively, consecutively numbered (e.g. adjacent) bit lines.

While certain features and aspects have been described with respect to exemplary embodiments, one skilled in the art will recognize that various modifications and additions can be made to the embodiments discussed without departing from the scope of the invention. Although the embodiments described above refer to particular features, the scope of this invention also includes embodiments having different combination of features and embodiments that do not include all of the above described features. For example, the methods and processes described herein may be implemented using hardware components, software components, and/or any combination thereof. Further, while various methods and processes described herein may be described with respect to particular structural and/or functional components for ease of description, methods provided by various embodiments are not limited to any particular structural and/or functional architecture, but instead can be implemented on any suitable hardware, firmware, and/or software configuration. Similarly, while certain functionality is ascribed to certain system components, unless the context dictates otherwise, this functionality can be distributed among various other system components in accordance with the several embodiments.

Moreover, while the procedures of the methods and processes described herein are described in a particular order for ease of description, various procedures may be reordered, added, and/or omitted in accordance with various embodiments. The procedures described with respect to one method or process may be incorporated within other described methods or processes; likewise, hardware components described according to a particular structural architecture and/or with respect to one system may be organized in alternative structural architectures and/or incorporated within other described systems. Hence, while various embodiments are described with or without certain features for ease of description, the various components and/or features described herein with respect to a particular embodiment can be combined, substituted, added, and/or subtracted from among other described embodiments. Consequently, although several exemplary embodiments are described above, it will be appreciated that the invention is intended to cover all modifications and equivalents within the scope of the following claims.

What is claimed is:

1. An apparatus comprising:
 a bit line pair;
 a sense amplifier coupled to the bit line pair;
 a first I/O line pair;
 a second I/O line pair;
 a first transfer gate coupled between the sense amplifier and the first I/O line pair; and
 a second transfer gate coupled between the sense amplifier and the second I/O line pair.

2. The apparatus of claim 1, further comprising:
 a first decoder coupled to the first transfer gate and configured to receive an address decoded signal; and
 a second decoder coupled to the second transfer gate and configured to receive the address decoded signal.

3. The apparatus of claim 2, further comprising:
 a first main amplifier coupled to the first I/O line pair; and
 a second main amplifier coupled to the second I/O line pair.

4. The apparatus of claim 3, further comprising a multiplexer configured to couple at least one of output nodes of the first main amplifier and the second amplifier to an output node of the multiplexer.

5. The apparatus of claim 4, further comprising a control circuit configured to:
 alternately provide a control signal to the first decoder and the second decoder to activate at least one of the first decoder and the second decoder which receives the control signal; and
 provide the control signal to the multiplexer to select the at least one of the output nodes of the first main amplifier and the second main amplifier.

6. The apparatus of claim 2, further comprising a control circuit configured to alternately provide a control signal to the first decoder and the second decoder to activate one of the first decoder and the second decoder which receives the control signal.

7. The apparatus of claim 1, further comprising:
an additional bit line pair;
an additional sense amplifier coupled to the additional bit line pair;
a third transfer gate coupled between the additional sense amplifier and the first I/O line pair; and
a fourth transfer gate coupled between the additional sense amplifier and the second I/O line pair.

8. The apparatus of claim 7, further comprising:
a third decoder coupled to the third transfer gate and configured to receive an additional address decoded signal; and
a fourth decoder coupled to the fourth transfer gate and configured to receive the additional address decoded signal.

9. The apparatus of claim 8, further comprising:
a first main amplifier coupled to the first I/O line pair; and
a second main amplifier coupled to the second I/O line pair.

10. The apparatus of claim 9, further comprising a multiplexer configured to couple at least one of output nodes of the first main amplifier and the second amplifier to an output node of the multiplexer.

11. The apparatus of claim 10, further comprising a control circuit configured to:
alternately provide a control signal to each of the first and third decoders and each of the second and fourth decoders to activate one of each of the first and third decoders and each of the second and fourth decoders which receives the control signal; and
provide the control signal to the multiplexer to select the at least one of the output nodes of the first main amplifier and the second main amplifier.

12. The apparatus of claim 8, further comprising a control circuit configured to alternately provide a control signal to each of the first and third decoders and each of the second and fourth decoders to activate one of each of the first and third decoders and each of the second and fourth decoders which receives the control signal.

13. An apparatus comprising:
a first sense amplifier;
a second sense amplifier;
a first I/O line pair;
a second I/O line pair;
a first transfer gate coupled between the first sense amplifier and the first I/O line pair;
a second transfer gate coupled between the second sense amplifier and the second I/O line pair;
a first main amplifier coupled to the first I/O line pair; and
a second main amplifier coupled to the second I/O line pair,
wherein the first transfer gate is conductive and the first main amplifier is activated when the second transfer gate is nonconductive and the second main amplifier is inactivated.

14. The apparatus of claim 13, wherein the second transfer gate is conductive and the second main amplifier is activated when the first transfer gate is nonconductive and the first main amplifier is inactivated.

15. The apparatus of claim 14, further comprising a multiplexer coupled to the first main amplifier and the second main amplifier, the multiplexer configured to select at least one of a first output of the first main amplifier and a second output of the second main amplifier.

16. The apparatus of claim 15, wherein the multiplexer is further configured to select the one of the first output of the first main amplifier and the second output of the second main amplifier responsive, at least in part, to a control signal which indicates whether a column address input with a column command corresponds to an even or an odd bit line.

17. The apparatus of claim 13, further comprising:
a third transfer gate coupled between the first sense amplifier and the second I/O line pair; and
a fourth transfer gate coupled between the second sense amplifier and the first I/O line pair.

18. The apparatus of claim 17, wherein the first and fourth transfer gate are controlled responsive, at least in part, to a control signal and the second and third transfer gate are controlled responsive, at least in part, to an inverted control signal.

19. The apparatus of claim 18, wherein the first and third transfer gate are controlled responsive, at least in part, to a first address decoded signal and the second and fourth transfer gate are controlled responsive, at least in part, to a second address decoded signal.

20. The apparatus of claim 19, further comprising a multiplexer coupled to the first main amplifier and the second main amplifier, the multiplexer configured to select at least one of a first output of the first main amplifier and a second output of the second main amplifier responsive to the control signal.

* * * * *